United States Patent
Flach et al.

(10) Patent No.: US 7,783,372 B2
(45) Date of Patent: Aug. 24, 2010

(54) AUTOMATED THROUGHPUT CONTROL SYSTEM AND METHOD OF OPERATING THE SAME

(75) Inventors: Gunnar Flach, OT Gorknitz (DE); Thomas Quarg, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/511,719

(22) Filed: Jul. 29, 2009

(65) Prior Publication Data

US 2009/0292385 A1 Nov. 26, 2009

Related U.S. Application Data

(63) Continuation of application No. 11/247,373, filed on Oct. 11, 2005, now abandoned.

(30) Foreign Application Priority Data

Feb. 28, 2005 (DE) ........................ 10 2005 009 022

(51) Int. Cl.
*G06F 19/00* (2006.01)
(52) U.S. Cl. ........................................ 700/108; 700/19
(58) Field of Classification Search ............... 700/19, 700/96, 108, 121, 99, 213, 228; 430/14, 430/16; 705/30; 719/4
See application file for complete search history.

(56) References Cited

U.S. PATENT DOCUMENTS

| 6,646,660 | B1 | 11/2003 | Patty | 700/17 |
|---|---|---|---|---|
| 6,662,066 | B1 | 12/2003 | Yu et al. | 700/108 |
| 6,751,517 | B1 | 6/2004 | Chou et al. | 700/121 |
| 6,950,716 | B2 | 9/2005 | Ward et al. | 700/121 |
| 6,970,758 | B1 | 11/2005 | Shi et al. | 700/108 |
| 7,184,850 | B1 * | 2/2007 | Logsdon et al. | 700/100 |
| 7,315,851 | B2 * | 1/2008 | Cheng et al. | 707/3 |
| 2001/0039462 | A1 | 11/2001 | Mendez et al. | 700/45 |
| 2003/0004586 | A1 | 1/2003 | O'Grady et al. | 700/108 |
| 2004/0040003 | A1 | 2/2004 | Seligson et al. | 716/4 |

FOREIGN PATENT DOCUMENTS

| DE | 197 45 386 A1 | 8/1998 |
|---|---|---|
| DE | 199 01 209 A1 | 7/2000 |
| DE | 102 28 804 A1 | 2/2003 |
| DE | 102 03 997 A1 | 8/2003 |
| DE | 102 40 115 A1 | 3/2004 |

OTHER PUBLICATIONS

Translation of Official Communication from German Patent Application No. 10 2005 009 022.2-32 dated Nov. 7, 2005.

* cited by examiner

*Primary Examiner*—Kidest Bahta
(74) *Attorney, Agent, or Firm*—Williams, Morgan & Amerson, P.C.

(57) ABSTRACT

An automated throughput control system and method is provided. By gathering tool specific information of a plurality of process tools on entity level, appropriate throughput related performance characteristics may be calculated with high statistical significance during moderately short time intervals. Moreover, the performance characteristics obtained from tool information may be compared to reference data, for instance provided by dynamic simulation calculations, to identify high, as well as low, performing equipment on the basis of standard process control mechanisms.

18 Claims, 1 Drawing Sheet

AUTOMATED THROUGHPUT CONTROL SYSTEM AND METHOD OF OPERATING THE SAME

CROSS-REFERENCE TO RELATED APPLICATION

This is a continuation of application Ser. No. 11/247,373, filed Oct. 11, 2005 now abandoned.

BACKGROUND OF THE INVENTION

1. Field of the Invention

Generally, the present invention relates to the field of fabricating integrated circuits, and, more particularly, to the monitoring of process tool throughput of a plurality of process tools required for processing different products with different process recipes.

2. Description of the Related Art

Today's global market forces manufacturers of mass products to offer high quality products at a low price. It is thus important to improve yield and process efficiency to minimize production costs. This holds especially true in the field of semiconductor fabrication, since here it is essential to combine cutting edge technology with mass production techniques. It is, therefore, the goal of semiconductor manufacturers to reduce the consumption of raw materials and consumables while at the same time improving process tool utilization. The latter aspect is especially important, since modern semiconductor facilities equipment is required, which is extremely cost-intensive and represents the dominant part of the total production costs.

Integrated circuits are typically manufactured in automated or semi-automated facilities, thereby passing through a large number of process and metrology steps to complete the device. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins to fulfill the specifications for the device under consideration. Since many of these processes are very critical, a plurality of metrology steps have to be performed to efficiently control the process flow. Typical metrology processes may include the measurement of layer thickness, the determination of dimensions of critical features, such as the gate length of transistors, the measurement of dopant profiles, and the like. As the majority of the process margins are device specific, many of the metrology processes and the actual manufacturing processes are specifically designed for the device under consideration and require specific parameter settings at the adequate metrology and process tools.

In a semiconductor facility, usually a plurality of different product types are manufactured at the same time, such as memory chips of different design and storage capacity, CPUs of different design and operating speed, and the like, wherein the number of different product types may even reach a hundred and more in production lines for manufacturing ASICs (application specific ICs). Since each of the different product types may require a specific process flow, different mask sets for the lithography, specific settings in the various process tools, such as deposition tools, etch tools, implantation tools, CMP (chemical mechanical polishing) tools, and the like, may be necessary. Consequently, a plurality of different tool parameter settings and product types may be encountered simultaneously in a manufacturing environment.

Hereinafter, the parameter setting for a specific process in a specified process tool or metrology or inspection tool may commonly be referred to as a process recipe or simply as a recipe. Thus, a large number of different process recipes, even for the same type of process tools, may be required which have to be applied to the process tools at the time the corresponding product types are to be processed in the respective tools. However, the sequence of process recipes performed in process and metrology tools or in functionally combined equipment groups, as well as the recipes themselves, may have to be frequently altered due to fast product changes and highly variable processes involved. As a consequence, the tool performance, especially in terms of throughput, is a very critical manufacturing parameter as it significantly affects the overall production costs of the individual devices. The progression of throughput over time of individual process and metrology tools, or even certain entities thereof such as process modules, substrate robot handlers, load ports and the like, may, however, remain unobserved due to the complexity of the manufacturing sequences including a large number of product types and a corresponding large number of processes, which in turn are subjected to frequent recipe changes. Hence, low-performing tools may remain undetected for a long time, when the performance of an equipment group which the tool under consideration belongs to is within its usual performance margin that typically has to be selected to allow a relatively wide span of variations, owing to the complexity of the processes and the tools involved.

Ideally, the effect of each individual process on each substrate would be detected by measurement and the substrate under consideration would be released for further process only if the required specifications were met. A corresponding process control in view of the result of each individual process, however, is not practical, since measuring the effects of certain processes may require relatively long measurement times or may even necessitate the destruction of the sample. Moreover, immense effort in terms of time and equipment would have to be made on the metrology side to provide the required measurement results. Additionally, utilization of the process tools involved would be minimized, since the tool would be released only after the provision of the measurement result and its assessment.

Typically, due to the lack of "knowledge" regarding the effect of the individual processes owing to the restricted metrology capability, statistical methods, such as mean values and corresponding standard deviations and the like, have been introduced for adjusting process parameters to significantly relax the above problem and to allow a moderately high utilization of the process tools, while at the same time attaining a relatively high product yield. Moreover, a process control strategy has been introduced and is continuously improved which allows a high degree of process control, desirably on a run-to-run basis, without the necessity of an immediate response of a measurement tool. In this control strategy, the so-called advanced process control, a model of a process or of a group of inter-related processes, is established and implemented in an appropriately configured process controller. Based on a certain amount of measurement results of preceding and/or subsequent processes, a feed forward and/or feedback control loop is established to maintain the process variability within predefined tolerances. Although well-established statistical process control (SPC) mechanisms, in combination with advanced process control (APC) strategies, provide the potential for achieving a high degree of quality of the products on the basis of a restricted amount of process information, these strategies may not sufficiently take into consideration other performance criteria of a process line, such as the throughput of the process tools involved. For instance, the malfunction of an entity of a process tool, such as a process module, a substrate handler robot, a load port and the like, may not necessarily severely compromise the quality of the substrates processed, but may in a more or less subtle manner influence the overall throughput of the process tool or a group of process tools. Similarly, process changes and/or setup changes of one or more process tools, which may be performed to take into account process variations and/or to improve results of individual processes, may even promote an enhanced quality of the result of the process or processes under consideration, but may result in a reduced throughput owing to, for instance, increased robot activities, additional recipe steps and the like. Hence, monitoring of the performance of equipment and equipment groups with respect to throughput efficiency is highly complex, and even throughput studies at entity level, i.e., monitoring some or all of the individual entities comprising a specified process tool, such as process modules, robot handlers, load ports and the like, may represent a less attractive solution, since resources in operations and industrial engineering are limited and an immediate response to the throughput changes may not be practical, even though the throughput studies may reveal certain details regarding one or more specified process tools.

In view of the situation described above, there is therefore a need for an enhanced technique that enables enhancement of the efficiency of a semiconductor production process, especially in view of throughput related issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to an automated throughput control (ATC) system to provide the potential for monitoring throughput related parameters in an automated fashion, thereby enabling substantially continuous data collection for the assessment of the throughput efficiency with high statistical significance, since a great amount of process data may be gathered and processed. Consequently, even subtle throughput related performance variations may be automatically detected and may be compensated for or otherwise used for further control tasks. Thus, in illustrative embodiments, a throughput related performance characteristic is determined for a plurality of process tools, wherein the throughput related performance characteristic is defined as a quantitative measure of the throughput performance of a process tool in relation to a specified reference performance of the process tool under consideration of the operating conditions of the process tool.

According to one illustrative embodiment of the present invention, a system comprises an interface configured to receive process messages from a plurality of process tools. Furthermore, a throughput control unit is provided, which is connected to the interface and which is configured to automatically determine a throughput related performance characteristic for each of the plurality of process tools.

In accordance with yet another illustrative embodiment of the present invention, a method comprises receiving process messages from a plurality of process tools used in a manufacturing process line by a throughput control unit and determining a throughput related performance characteristic for each of the plurality of process tools on the basis of the process messages. In illustrative embodiments, the method may further comprise performing control tasks related to the plurality of process tools on the basis of the performance characteristic.

BRIEF DESCRIPTION OF THE DRAWINGS

The invention may be understood by reference to the following description taken in conjunction with the accompanying drawings, in which like reference numerals identify like elements, and in which.

Figure 1A:
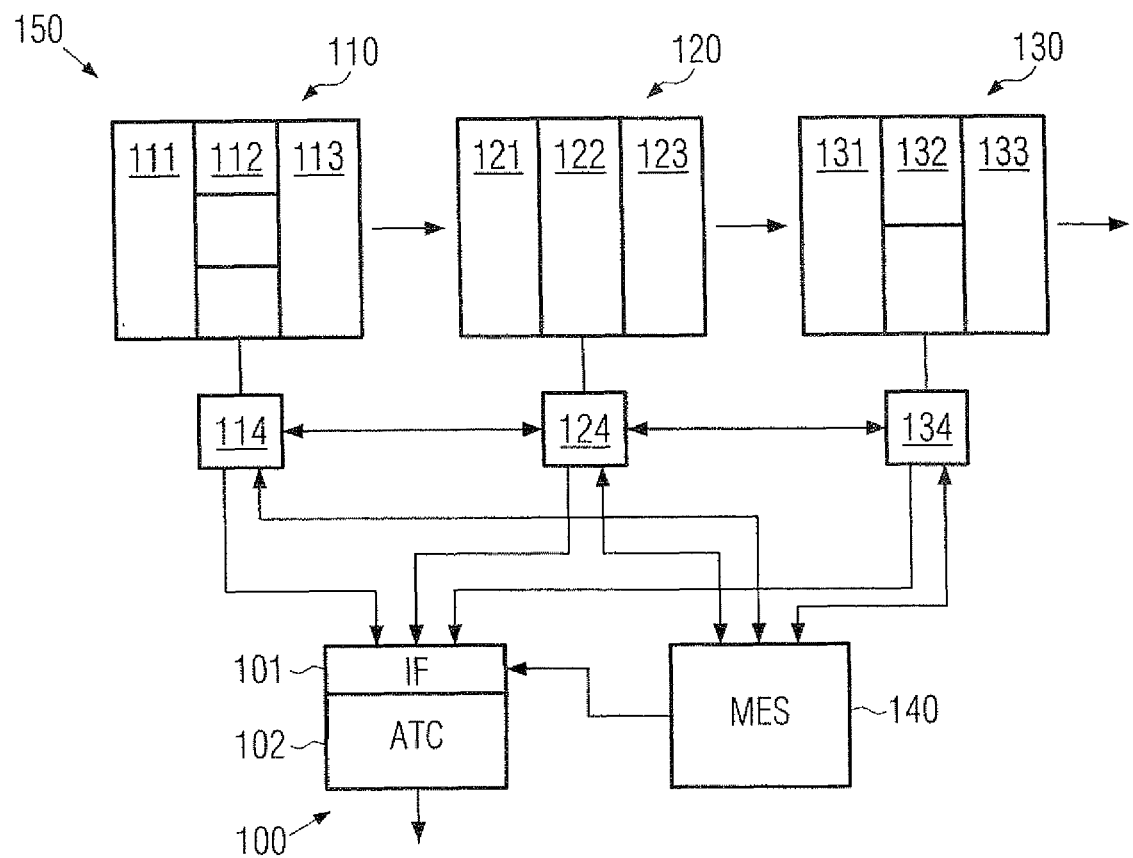
FIG. 1a schematically depicts a system for monitoring and/or controlling the throughput of a plurality of process tools in an automated fashion in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention provides an automated throughput monitoring and/or controlling system to significantly enhance process efficiency, which may suffer in conventional process lines from unobserved throughput losses caused by, e.g., process and setup changes and/or, equipment malfunction. By automatically monitoring the throughput behavior of at least some process tools in a semiconductor process line, deficiencies with respect to throughput may be revealed, which may conventionally be hidden behind the "usual" variability of the manufacturing processes when average throughput rates are calculated from lot processing times or even from steady state output data. For instance, the monitoring of the throughput of equipment groups on a monthly basis, as is frequently practiced in semiconductor facilities, may mask some severe throughput deficiencies of particular tools due to the variability of the whole group. Contrary thereto, statistically significant tool parameters related to the throughput of individual tools or even individual entities of a single process tool may be determined by automatically gathering at least tool messages, which may then be automatically recorded and processed to obtain a substantially continuous data stream at tool or even entity level, enabling the assessment of the currently existing performance with respect to throughput of the process tools. Based on these throughput related performance results, further control activities may be initiated, which may be accomplished on the basis of automated control routines and/or on the basis of operator interaction. Moreover, based on the throughput related performance assessments, high and low performance tools may be identified for further process optimization, wherein corresponding "standards" may be determined on the basis of dynamic models of tools and entities and/or on the basis of the recorded tool messages and/or process data from a supervising manufacturing execution system.

FIG. 1a schematically shows a manufacturing environment 150 of a semiconductor facility. The environment 150 may comprise a plurality of process tools 110, 120 and 130, which may be arranged to perform a sequence of process steps required for fabricating a semiconductor device of specified configuration. It should be appreciated that the plurality of process tools 110, 120, 130 may not necessarily represent process tools that are sequentially passed by a substrate carrying the semiconductor device, but may also represent semiconductor tools that may process semiconductor devices in a parallel fashion, wherein one or more of the tools 110, 120, 130 may perform similar processes with a different tool configuration adapted to different types of semiconductor devices to be processed. In other cases, the process tools 110, 120, 130 may represent any group of tools which may form a "functional" unit having a significant variability with respect to an overall throughput of the tools 110, 120, 130 when considered as a group due to the complexity of processes performed by the tools 110, 120, 130 and the diversity of different products processed by these tools. It should further be appreciated that the term "process tool" is meant to include any metrology tool, such as inspection tools, measurement tools for gathering electrical data and the like, as are typically used in a semiconductor process line for creating so-called in line measurement data. For instance, the process tool 110 may represent a lithography station, which in turn may comprise one or more lithography tools, one or more development stations, one or more resist coating stations and any other pre- and post-exposure treatment stations. When the tools 110, 120, 130 represent a substantially sequentially arranged equipment group, the tool 120 may then represent a measurement tool which is configured to, for instance, determine the critical dimension of a resist feature formed by the process tool 110. The process tool 130 may then represent an advanced etch system configured to form a corresponding microstructure feature on the basis of the resist feature measured by the tool 120. As may be appreciated, each process performed in each of the process tools 110, 120, 130 is highly complex and may require sophisticated process control mechanisms to provide a microstructure feature at the output of the process tool 130 that is within specified process margins. However, since the tools 110, 120, 130 may have to process a variety of different semiconductor devices, requiring different types of process recipes, which in turn may have to be continuously improved and adapted, the overall throughput of the tools 110, 120, 130 may significantly vary and thus impart a high throughput related variability to the whole sequence, which may obscure a significant throughput drop of one of the tools 110, 120, 130 or any specific component thereof. Moreover, conventionally, it is extremely difficult to determine a tool status for each of the process tools 110, 120, 130 which indicates a status of high throughput or of low throughput with respect to a specified tool configuration.

Each of the process tools 110, 120, 130 typically comprises a plurality of components, which are also referred to as entities, and which may represent process modules or process chambers, when cluster tools are considered, substrate handling robots, load ports, and the like. For instance, the tool 110 may comprise a port 111 for loading a substrate and a port 113 for unloading the substrate after processing, and one or more process modules 112. Similarly, the tool 120 may comprise a process module entity 122 and load and unload entities 121 and 123, respectively. Finally, the tool 130 may comprise load and unload entities 131, 133 and one or more process module entities 132.

It should be appreciated that each of the entities of the tools 110, 120, 130 may itself be comprised of one or more entities, wherein an entity may generally be considered as a part of the process tool whose activity may be controlled and monitored on an individual basis. For instance, a cluster tool may have a substrate load port including a robot handling device including a plurality of peripheral components required for the proper operation of the load port, wherein no external access to these peripheral components is provided. In this case, the load port may be considered as an individual basic entity, since its process status may be observed via tool messages, for instance when the load port is processing or is in an idle mode, while the current status of the peripheral components is not observable on the basis of tool messages. Thus, when it is referred to receiving data or information on an "entity" basis from a specified process tool, it is meant that the process status of at least some of the entities is detected, thereby providing an enhanced "resolution" with respect to individual functions of the process tools 110, 120, 130 on a substantially continuous basis. Moreover, each of the process tools 110, 120, 130 comprises a respective interface, 114, 124, 134 which are configured to allow communication with a supervising system, an operator, or other process tools and peripheral components.

In the embodiment shown, the manufacturing environment 150 comprises a manufacturing execution system 140, which is typically provided in semiconductor production facilities to manage resources, raw materials, process tools, process recipes, etc. in coordinating the various process flows within the manufacturing environment 150. Thus, the manufacturing execution system 140 may receive tool-specific information from the plurality of process tools 110, 120, 130 and may, in response to process requirements and/or in response to the tool-specific information obtained, issue corresponding instructions to one or more of the process tools 110, 120, 130. Furthermore, the manufacturing environment 150 comprises a system 100 for automatic monitoring and/or controlling of throughput related characteristics of the process tools 110, 120, 130. The system 100 comprises an interface 101 connected to the respective tool interfaces 114, 124, 134 to at least receive tool-specific information from one or more of the tools 110, 120, 130. In one illustrative embodiment, the interface 101 may be configured to enable the receipt of standard SECS (SEMI equipment communications standard) messages, thereby providing the potential for data transfer with a wide variety of semiconductor process tools, as most of these tools support the corresponding protocol. In a further illustrative embodiment, the interface 101 may further be configured to receive process data from the manufacturing execution system 140, whereas, in other embodiments, the data transfer between the interface 101 and the interfaces 114, 124, 134 and the manufacturing execution system 140 may be bi-directional to allow throughput related data and control data to be directly communicated between the system 100 and the process tools 110, 120, 130 and/or the manufacturing execution system 140. It should be appreciated that tool data may also be entirely provided by the manufacturing execution system 140 so that the interface 101 may not need to be directly connected to the individual tool interfaces 114, 124, 134, as long as the tool messages are provided to the manufacturing execution system 140.

Moreover, the system 100 comprises an automated throughput controller 102 connected to the interface 101 and configured to determine, on the basis of data obtained from the process tools 110, 120, 130 and/or the manufacturing execution system 140, a throughput related performance characteristic for each of the process tools 110, 120 and 130. For instance, a throughput related performance characteristic may be represented by any value that describes the tool performance and possibly a variance thereof. For example, tool parameters that may be used for obtaining a representative performance characteristic may be the process times and idle times of the individual process modules 112, 122, 132, robot movement times and robot idle times in the entities 111, 113, 121, 123, 131, 133, or intervals of these specific values. Based on these input parameters, the throughput related performance characteristic may be obtained by an appropriate operation, such as an adjusted average of some or all of these values, thereby generating a measure of tool performance, which may be comparable to other performance characteristics of process tools of different types. For example, process-specific activities, such as process chamber processing times and idle times may be related to the associated substrate handling times to create a measure for each of the process tools 110, 120, 130 that is significant for each tool irrespective of the type of tool. For instance, if the overall throughput of a process tool is identified to be substantially dominated by substrate handling activities, the corresponding tool configuration or tool control software may inefficiently be set up and thus may require a reconfiguration.

Other throughput related performance characteristics may simply be represented by the process times of the individual entities 112, 122 and 132 or the time intervals between input of a substrate and output of a substrate of the respective process tool 110, 120, 130.

During operation of the system 100 in the manufacturing environment 150, the manufacturing execution system 140 may set up the process tools 110, 120, 130 in accordance with one or more specified product types to be processed so that each tool is configured to carry out a specific process recipe for the specific substrate arriving at the tool in accordance with a specified schedule. In the above-described example, the process tool 110 representing a photolithography station may be operated with a specified reticle, while the tool 120, representing a measurement tool, may be prepared to receive some of the substrates processed by tool 110 for generating measurement data, which may then be provided to the tool 110 to allow an enhanced process control. Similarly, the manufacturing execution system 140 may correspondingly set up the process tool 130, for instance representing an etch system, such that an appropriate etch chemistry may be provided within the process module 132. As previously noted, although the tools 110, 120, 130 may be coordinated by the manufacturing execution system 140 in accordance with well-specified process and product requirements, the overall performance of the manufacturing environment 150 may not be predicted very efficiently, in particular with respect to the overall throughput of the environment 150, due to the complexity of the processes and the tools involved, even though advanced process control strategies may be used in each of the tools 110, 120, 130 and possibly in the supervising manufacturing execution system 140. In particular, with respect to the assessment of the presently achieved throughput of the environment 150, due to the lack of information typically encountered in conventional manufacturing environments without the system 100, usually the overall throughput in the manufacturing environment 150 varies over a wide range, wherein fluctuations within this range may not easily be correlated to the performance of individual tools or entities.

In the embodiments of the present invention, tool-specific information is provided from each of the tools 110, 120, 130 via the respective interfaces 114, 124, 134 and or the manufacturing execution system 140 to the system 100, wherein this information may be obtained on a substantially continuous basis, thereby enabling the assessment of the throughput behavior on the basis of moderately short time intervals at high statistical significance. In some embodiments, every activity in each of the process tools 110, 120, 130 is reported to the system 100, such as every substrate handling process, every process step in each of the entities 112, 122, 132, and the like, to provide the potential of obtaining the respective performance characteristics of each of the tools with a high statistical significance. In some embodiments, the system 100 may further receive additional process data from the manufacturing execution system 140, which may be used in combination with the messages directly related to the tools 110, 120, 130 in order to determine the respective performance characteristics on the basis of additional information, thereby endowing a higher significance to the determined performance characteristics. For example, the manufacturing execution system 140 may provide information on the specifics of the tool configuration that may not be directly obtained by the system 100, such as type of raw materials, such as precursor gases and the like, and/or the manufacturing execution system 140 may provide information on the process strategy that may directly or indirectly influence the effective throughput of the manufacturing environment 150.

As one illustrative example, the processing of any pilot or test substrates to establish desired process conditions may not be relevant for the actual or "pure" throughput related performance characteristic of a specific process tool but may have a significant impact on the effective or "product" throughput of the tool, since precious process time, which is spent on test and pilot substrates, may not be available for the processing of actual product substrates, while nevertheless the actual throughput performance of the tool under consideration may be quite high. Hence, the throughput related performance characteristic determined by the throughput controller 102 may, in some embodiments, also represent the effective, that is product-related, throughput, thereby providing a measure for the quality of setup procedures and process strategies of the tool under consideration.

After determining a throughput related performance characteristic for each of the tools 110, 120, 130 on the basis of messages received from these tools, and possibly on the basis of process data received from the manufacturing execution system 140, an appropriate control activity may be performed on the basis of the performance characteristics. For example, the performance characteristic of the tool 110 may represent an averaged process time of each of the process modules 112, wherein the average may be taken for a specified time interval. If the configuration of each of the process modules 112 is substantially the same and identical process recipes are to be carried out in each of the process modules 112, a significant difference in the respective performance characteristics may indicate a tool irregularity and may initiate a corresponding control activity, such as an interaction of an operator. In other cases, the control activity initialized by the throughput controller 102 on the basis of the performance characteristics may simply be a data transfer to a display device or to the manufacturing execution system 140 or any other supervising system connected to the system 100, in which the corresponding performance characteristics may be recorded and be used for further processing, such as statistical analysis and the like. In other embodiments, "reference" data for evaluating the performance characteristics determined on the basis of the received data may be generated by the system 100 on the basis of a plurality of substantially identical entities or entire process tools operated under identical conditions. For instance, if the process tools 110, 120, 130 are to represent substantially identical tools, which may be operated under identical tool configurations with identical process recipes, at least temporarily, the correspondingly determined performance characteristics may be analyzed to extract "optimum" performance data. That is, the corresponding performance characteristics may be determined for each of the tools 110, 120, 130 when operated with identical conditions, wherein the tools 110, 120, 130 do not need to be operated with identical conditions at the same time. From these values, those values representing the maximum performance may be selected and may be considered as a standard for a status of high performance. Based on these reference data, the throughput controller 102 may compare the presently determined performance characteristics and may identify low performance tools and high performance tools in an automated manner.

In other embodiments, standard statistical process control (SPC) mechanisms may be implemented by the throughput controller 102 to monitor and/or control the manufacturing environment 150. For instance, control charts as are typically used in SPC mechanisms may be established, which specify the limits of the parameters under consideration and which define the conditions of out of control (OOC) situations. A control chart may typically be represented by a graphic representation of the deviation of a parameter from an averaged value over time, wherein limits for a valid range of deviations are plotted simultaneously. For example, frequently, a range of ±three standard deviations may be considered appropriate for defining a valid range of a parameter to be monitored. Corresponding control charts may be established for one or more of the performance characteristics within a predefined time interval. In one illustrative embodiment, a shift change may represent a control interval and thus an appropriate period for assessing the throughput performance and possibly initiating any control activities.

Typically, a fast response to any throughput related issues is desirable in the manufacturing environment 150, and therefore even shorter control intervals may be selected, depending on the statistical significance of the data received from the process tools 110, 120, 130. In some embodiments, the control intervals may be selected individually for each of the tools 110, 120, 130, depending on the individual typical throughput rates. For example, a process tool operated on a single substrate basis requiring moderately high wafer handling activity may possibly require a longer control interval compared to a process tool designed to process multiple substrates simultaneously such that a ratio of substrate handling time and process time is low. The establishing of appropriate control intervals, i.e., time intervals for determining the respective performance characteristics, and of corresponding limits of the controlled parameters and of defining the conditions of out of control situations, may be performed in advance, for instance, using the system 100 by computing a plurality of appropriate candidates for the performance characteristics over relatively short time periods. From these data, different types of mean values resulting in different variances may be calculated to determine appropriate representatives of performance characteristics, such as process times of individual entities/process modules and/or substrate in/out intervals averaged over appropriate time intervals.

Moreover, "global" performance characteristics may be established, which allow the common assessment of different types of process tools so as to be able to locate "bottlenecks" within a process sequence during actual production conditions. Such "global" performance characteristics may be established on the basis of ideal reference behavior of the specific tool under consideration. For this purpose, the throughput related characteristic might be normalized with respect to the reference characteristic for a specified tool type for specified tool configurations, for example, by setting the reference characteristic to one so that any deviation from the reference behavior may be indicated by a value less than one. In this case, different types of tools may directly be compared with each other to monitor the development of the throughput behavior of highly correlated process tools as well as of highly uncorrelated process tools.

Figure 1B:
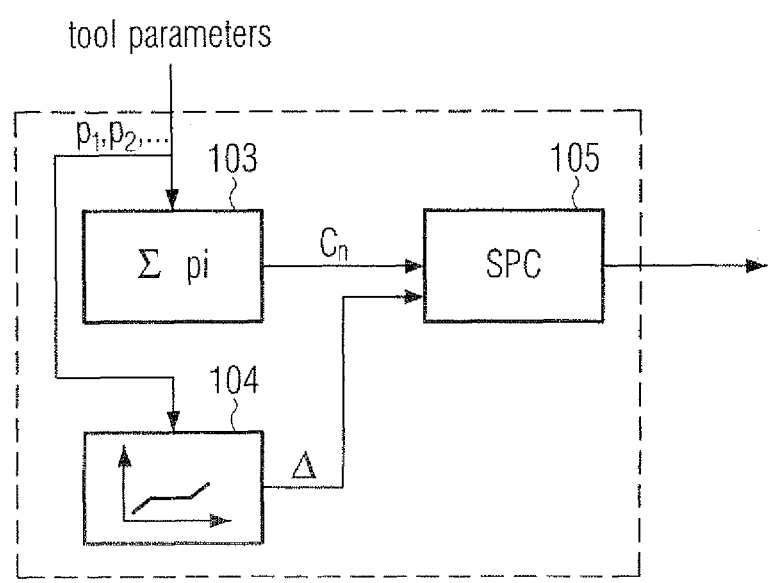
FIG. 1b schematically shows an automated throughput controller (ATC) in accordance with further illustrative embodiments of the present invention in more detail.

FIG. 1*b* schematically shows a portion of the system 100 in accordance with further illustrative embodiments of the present invention and the function and mutual relationship of components of the system 100. In some embodiments, the throughput controller 102 may be comprised of a framework of software tools implemented in an appropriate computer system and/or the throughput controller 102 may be implemented in the form of a combined hard ware and software structure to provide the required resources for performing the processes described above or referred to in the following description. For instance, the throughput controller 102 may be comprised in the manufacturing execution system 140 and may there fore use a part of the hardware and software resources provided in the manufacturing execution system 140. In other embodiments, the throughput controller 102 may be implemented in any appropriate computer system, such as a work station, a personal computer, and the like, wherein any peripheral components for data communication, such as the interface 101, may be provided in any appropriate form, such as a communication module for wireless data transfer, or any other network structure, and the like. Implemented as software tool and/or dedicated hardware circuitry, the controller 102 may comprise a module 103 for calculating appropriate throughput related performance characteristics C for a plurality of process tools, such as the tools 110, 120, 130. Moreover, the controller 102 may comprise a module 104 for generating reference data for the performance characteristics C on the basis of the tool parameters.

In one particular embodiment, the reference data module 104 may have implemented therein a plurality of simulation models representing a desired or "ideal" tool behavior under a tool configuration represented by the tool parameters received. For instance, the module 104 may have implemented therein a plurality of parameter values for a plurality of performance characteristics C representing the target or ideal value for a large number of tool configurations. Thus, based on the tool parameters received, the tool configuration associated therewith may be identified by the module 104 and thus the corresponding ideal value for the respective performance characteristics C may be selected for the further processing of the tool data, for instance for comparing with the currently estimated performance characteristic C. In other embodiments, mathematical models of tool activities on entity basis may be implemented and may be used in real time to establish the required reference data. In one illustrative embodiment, the simulation models used represent discrete event simulation models, which are able to model dynamic tool characteristics, such as process variability, internal substrate scheduling, robot limitations, transient behavior, and the like.

On the basis of the reference data provided by the module 104, any deviations of the currently determined performance characteristics C from the ideal or reference behavior of the tool under consideration may be identified to recognize any deficiencies in tool setup and/or tool software. For this purpose, the throughput controller 102 may in one illustrative embodiment comprise a module 105 implementing a statistical process control mechanism, which may receive corresponding output results of the modules 103 and 104 to produce corresponding output information, which may directly be used for tool control activities and/or efficiency assessment, or which may be delivered to the manufacturing execution system 140 as a further control parameter. The module 105 may have implemented any appropriate control charts as explained above with reference to FIG. 1a, wherein corresponding limits of the variance of the performance characteristics C may be defined on the basis of the reference data generated in the module 104. For example, if a significant deviation of the presently determined characteristic C from a corresponding ideal or reference value is detected, an out of control event may be created. Based on the output information of the module 105, a throughput related assessment of the plurality of process tools 110, 120, 130 may be obtained, thereby providing the potential for identifying process tools and/or entities thereof with high performance and with low performance in an automated fashion, wherein the full information on an entity basis may be used to obtain the corresponding performance characteristics C with a high statistical significance. Consequently, process optimization may be performed not only on the basis of the quality of the semiconductor devices processed in the manufacturing environment 150, but also on the basis of throughput related characteristics established by the system 100, thereby contributing to enhanced production yield at reduced production cost.

As a result, the present invention provides a new technique for estimating the throughput characteristics of a manufacturing environment in an automated manner, wherein tool specific information may be gathered on an entity level for a plurality of process tools, thereby providing high statistical significance within moderately short time intervals. Thus, even subtle throughput related issues in the manufacturing environment may be detected and a corresponding control activity may be initiated as soon as a corresponding decrease in throughput is identified. In evaluating throughput related performance characteristics of a plurality of process tools, appropriate tool information, for instance provided in the form of standard SECS messages, possibly in combination with process data received from a manufacturing execution system, may be used to automatically compute the performance characteristics at entity level. Based on this data, statistical process control mechanisms may be used to reliably monitor and/or control or supervise the equipment performance. The performance characteristics calculated on the basis of tool information may be compared with corresponding reference data, which may be obtained by theoretical models and/or experimental data, to identify shortcomings in setup as well as control software of the process tools involved. Moreover, by using the process information obtained from the manufacturing execution system, a correlation between tool configurations, control algorithm and process recipe may be established to recognize even subtle deficiencies in one or more of these factors. Thus, in some embodiments, the equipment performance gathered automatically at entity level and related to throughput characteristics and the deviation between reference data, for instance obtained as results of dynamic simulation, and the actual equipment performance are provided as input for an SPC system to identify low as well as high performing equipment and/or entities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system, comprising:
   an interface configured to receive process messages form a plurality of process tools;
   a throughput control unit connected to said interface and configured to automatically determine a throughput rate for each of said plurality of process tools under specified process tool parameters and identify a process tool of significance having a determined throughput rate outside a specified range, wherein the throughput rate indicates a number of items processed in the associated process tool over a particular time interval; and
   a reference data module operable to generate reference data for said specified range of the throughput rate by employing simulation models of said process tools using the specified tool parameters.

2. The system of claim 1, wherein said process messages comprise tool specific information relating to at least one of a chamber processing time, a chamber idle time, a substrate handler process time and a substrate handler idle time of at least one of said plurality of process tools.

3. The system of claim 1, wherein said interface is further configured to receive process data from a manufacturing execution system, said process data being related to at least one of said plurality of process tools.

4. The system of claim 1, wherein said throughput control unit comprises a statistical process control section configured to identify said process tool of significance on the basis of said determined throughput rates.

5. The system of claim 4, wherein said statistical process control section has implemented therein a control chart specifying a valid range of at least one of the throughput rates.

6. The system of claim 5, wherein said control chart is configured to define an out of control situation for said at least one throughput rate.

7. The system of claim 6, wherein said at least one throughput rate represents a process time of at least one entity of one or more of said plurality of process tools.

8. The system of claim 7, wherein said at least one throughput rate represents an overall processing time of a substrate processed by at least one of said plurality of process tools.

9. A method, comprising:
receiving process messages from a plurality of process tools used in a manufacturing process line by a throughput control unit;
determining a throughput rate for each of said plurality of process tools under specified process tool parameters on the basis of said process messages, wherein the throughput rate indicates a number of items processed in the associated process tool over a particular time interval;
identifying a process tool of significance having a determined throughput rate outside a specified range; and
generating reference data for said specified range of the throughput rate by employing simulation models of said process tools using the specified tool parameters.

10. The method of claim 9, wherein said tool messages comprise tool specific information relating to at least one of a chamber processing time, a chamber idle time, a substrate handler process time and a substrate handler idle time of at least one of said plurality of process tools.

11. The method of claim 9, further comprising receiving process data from a manufacturing execution system, said process data being related to at least one of said plurality of process tools.

12. The method of claim 11, wherein data on all tool activities at least for a predefined manufacturing interval are provided to said throughput control unit to enhance a statistical significance of said throughput rates.

13. The method of claim 9, further comprising performing control of said plurality of process tools on the basis of said throughput rates.

14. The method of claim 13, wherein performing control of said process tools comprises controlling said process tools on the basis of a statistical process control mechanism.

15. The method of claim 14, wherein controlling on the basis of said statistical process control mechanism comprises implementing control charts specifying a valid range of said throughput rates.

16. The method of claim 15, wherein said control charts define an out of control situation for each of said plurality of process tools.

17. The method of claim 15, wherein said control operation on the basis of said statistical process control mechanism is performed on the basis of a sampling time that is less or equal to a time interval of a shift change in a production facility accommodating said manufacturing process line.

18. The method of claim 9, wherein said simulation model is a discrete event model of said process tools for said specified tool parameters, said model representing an ideal tool behavior for said specified tool parameters.

* * * * *

UNITED STATES PATENT AND TRADEMARK OFFICE
CERTIFICATE OF CORRECTION

PATENT NO.         : 7,783,372 B2  
APPLICATION NO.    : 12/511719  
DATED              : August 24, 2010  
INVENTOR(S)        : Gunnar Flach and Thomas Quarg et al.

Page 1 of 1

It is certified that error appears in the above-identified patent and that said Letters Patent is hereby corrected as shown below:

Col. 12, line 45 (claim 1, line 2), delete "form" and insert therefor -- from --.

Signed and Sealed this
Tenth Day of April, 2012

David J. Kappos
*Director of the United States Patent and Trademark Office*